United States Patent [19]

Tang et al.

[11] Patent Number: 5,552,678

[45] Date of Patent: Sep. 3, 1996

[54] AC DRIVE SCHEME FOR ORGANIC LED

[75] Inventors: Ching W. Tang; Steven A. Van Slyke, both of Rochester, N.Y.

[73] Assignee: Eastman Kodak Company, Rochester, N.Y.

[21] Appl. No.: 311,619

[22] Filed: Sep. 23, 1994

[51] Int. Cl.[6] .......................... H01L 33/00; H05B 33/00
[52] U.S. Cl. .................. 315/169.3; 257/40; 313/504; 313/506
[58] Field of Search .................. 257/40, 98, 103; 313/504, 509, 506, 503; 315/169.3; 362/84, 800

[56] References Cited

U.S. PATENT DOCUMENTS

| | | | |
|---|---|---|---|
| 2,733,367 | 1/1956 | Gillson, Jr. | 313/108 |
| 3,172,862 | 3/1965 | Gurnee et al. | 252/301.3 |
| 3,173,050 | 3/1965 | Gurnee | 313/108 |
| 3,180,730 | 4/1965 | Klupfel et al. | 96/1 |
| 3,567,450 | 3/1971 | Brantly et al. | 96/1.5 |
| 3,603,833 | 9/1971 | Logan et al. | 257/103 X |
| 3,658,520 | 4/1972 | Brantly et al. | 96/1.6 |
| 3,710,167 | 1/1973 | Dresner et al. | 313/108 |
| 3,935,031 | 1/1976 | Adler | 136/206 |
| 4,035,686 | 7/1977 | Fleming | 313/503 |
| 4,175,960 | 11/1979 | Berwick et al. | 430/58 |
| 4,356,429 | 10/1982 | Tang | 313/503 |
| 4,539,507 | 9/1985 | VanSlyke et al. | 313/504 |
| 4,720,432 | 1/1988 | VanSlyke et al. | 428/457 |
| 4,869,973 | 9/1989 | Nishikawa et al. | 313/509 X |
| 4,885,211 | 12/1989 | Tang et al. | 428/457 |
| 5,210,430 | 5/1993 | Taniguchi et al. | 257/103 |
| 5,384,517 | 1/1995 | Uno | 315/169.3 |

FOREIGN PATENT DOCUMENTS 404000772  1/1992  Japan ......................... 257/40

OTHER PUBLICATIONS

J. Dresner, Double Injection Electroluminescence In Anthracene, pp. 322–334, RCA Review, Jun. 1969.

*Primary Examiner*—Robert Pascal
*Assistant Examiner*—Arnold Kinkead
*Attorney, Agent, or Firm*—Raymond L. Owens

[57] ABSTRACT

An electroluminescent device is disclosed comprising in sequence, an anode, an organic hole injecting and transporting zone, an organic electron injecting and transporting zone, and a cathode. An AC drive scheme for the electroluminescent device is disclosed which provides the device with a longer operational life.

5 Claims, 2 Drawing Sheets

AC DRIVE SCHEME FOR ORGANIC LED

FIELD OF THE INVENTION

This invention relates to organic electroluminescent devices. More specifically, this invention relates to devices which emit light from a current conducting organic layer.

BACKGROUND OF THE INVENTION

While organic electroluminescent devices have been known for about two decades, their performance limitations have represented a barrier to many desirable applications. (For brevity, EL, the common acronym for electroluminescent, is sometimes substituted.)

Representative of earlier organic EL devices are Gurnee et al U.S. Pat. No. 3,172,862, issued Mar. 9, 1965; Gurnee U.S. Pat. No. 3,173,050, issued Mar. 9, 1965; Dresner, "Double Injection Electroluminescence in Anthracene", RCA Review, Vol. 30, pp. 322–334, 1969; and Dresner U.S. Pat. No. 3,710,167, issued Jan. 9, 1973. The organic emitting material was formed of a conjugated organic host material and a conjugated organic activating agent having condensed benzene rings. Naphthalene, anthracene, phenanthrene, pyrene, benzopyrene, chrysene, picene, carbazole, fluorene, biphenyl, terpheyls, quarterphenyls, triphenylene oxide, dihalobiphenyl, trans-stilbene, and 1,4-diphenylbutadiene were offered as examples of organic host materials. Anthracene, tetracene, and pentacene were named as examples of activating agents. The organic emitting material was present as a single layer having thicknesses above 1 μm.

The most recent discoveries in the art of organic EL device construction have resulted from EL device constructions with the organic luminescent medium consisting of two extremely thin layers (<1.0 μm in combined thickness) separating the anode and cathode, one specifically chosen to inject and transport holes and the other specifically chosen to inject and transport electrons and also acting as the organic luminescent zone of the device. The extremely thin organic luminescent medium offers reduced resistance, permitting higher current densities for a given level of electrical biasing. Since light emission is directly related to current density through the organic luminescent medium, the thin layers coupled with increased charge injection and transport efficiencies have allowed acceptable light emission levels (e.g. brightness levels capable of being visually detected in ambient light) to be achieved with low applied voltages in ranges compatible with integrated circuit drivers, such as field effect transistors.

For example, Tang U.S. Pat. No. 4,356,429 discloses an EL device formed of an organic luminescent medium consisting of a hole injecting and transporting layer containing a porphyrinic compound and an electron injecting and transporting layer also acting as the luminescent zone of the device. In Example 1, an EL device is disclosed formed of a conductive glass transparent anode, a 1000 Angstrom hole injecting and transporting layer of copper phthalocyanine, a 1000 Angstrom electron injecting and transporting layer of tetraphenylbutadiene in poly(styrene) also acting as the luminescent zone of the device, and a silver cathode. The EL device emitted blue light when biased at 20 volts at an average current density in the 30 to 40 mA/cm$^2$ range. The brightness of the device was 5 cd/m$^2$.

A further improvement in such organic EL devices is taught by Van Slyke et al U.S. Pat. No. 4,539,507. Van Slyke et al realized a dramatic improvement in light emission by substituting for the hole injecting and transporting porphyrinic compound of Tang an aromatic tertiary amine layer. Referring to Example 1, onto a transparent conductive glass anode were vacuum vapor deposited successive 750 Angstrom hole injecting and transporting, 1,1-bis( 4-di p-tolylaminophenyl)cyclohexane and electron injecting and transporting 4,4'-bis(5,7-di-t-pentyl-2-benzoxazolyl)-stilbene layers, the latter also providing the luminescent zone of the device. Indium was employed as the cathode. The EL device emitting blue-green light (520 nm peak). The maximum brightness achieved 340 cd/m$^2$ at a current density of about 140 mA/cm$^2$ when the applied voltage was 22 volts. The maximum power conversion efficiency was about $1.4 \times 10^{-3}$ watt/watt, and the maximum EL quantum efficiency was about $1.2 \times 10^{-2}$ photon/electron when driven at 20 volts. Note particularly, that Example 1 of Van Slyke et al produced a maximum brightness of 340 cd/m$^2$ when the EL device was driven at 22 volts while Example 1 of Tang produced only 5 cd/m$^2$ when that EL device was driven at 20 volts.

The organic EL devices have been constructed of a variety of cathode materials. Early investigations employed alkali metals, since these are the lowest work function metals. Other cathode materials taught by the art have been higher work function (4 eV or greater) metals, including combinations of these metals, such as brass, conductive metal oxides (e.g. indium tin oxide), and single low work function (<4 eV) metals. Gurnee et al and Gurnee, cited above, disclosed electrodes formed of chrome, brass, copper and conductive glass. Dresner U.S. Pat. No. 3,710,167 employed a tunnel injection cathode consisting of aluminum or degenerate N$^+$ silicon with a layer of the corresponding aluminum or silicon oxide of less than 10 Angstroms in thickness. Tang, cited above, teaches useful cathodes to be formed from single metals with a low work function, such as indium, silver, tin, and aluminum while Van Slyke et al, cited above, discloses a variety of single metal cathodes, such as indium, silver, tin, lead, magnesium, manganese, and aluminum.

Tang et al, U.S. Pat. No. 4,885,211 discloses an EL device comprised of a cathode formed of a plurality of metals other than alkali metals, at least one of which has a work function of less than 4 eV.

Commonly assigned VanSlyke et al U.S. Pat. No. 4,720,432 described an electroluminescent device using an improved multi-layer organic medium. As set forth in this patent the electroluminescent or EL device can be driven by a direct voltage source or an alternating current (AC) voltage source or any intermittent power source. This EL device is basically a diode rectifier which permits electrical current to flow only in the forward bias voltage. This current excites the organic medium to produce electroluminescence. In reverse bias, the current is blocked from entering the diode and consequently no light emission is produced.

SUMMARY OF THE INVENTION

It is an object of the present invention to provide an improved alternating current voltage source arrangement for an organic light emitting device.

This object is achieved in an organic light emitting device (LED) having an anode and cathode and a light emitting structure disposed between such anode and cathode, the improvement comprising:

(a) an organic hole transporting layer;

(b) an organic luminescent layer; and (c) means for applying an alternating voltage across the anode
and cathode having a forward portion which biases the LED to produce light and a reverse portion in which substantially no light is produced, the voltage being selected so that the maximum forward voltage is less than or equal to the maximum reverse voltage in each AC voltage cycle. Although recent performance improvements in organic EL devices have suggested a potential for widespread use, most practical applications require limited voltage input or light output variance over an extended period of time. While the aromatic tertiary amine layers employed by Van Slyke et al, cited above, have resulted in highly attractive initial light outputs in organic EL devices, the limited stability of devices containing these layers has remained a deterrent to widespread use. Device degradation results in obtaining progressively lower current densities when a constant voltage is applied. Lower current densities in turn result in lower levels of light output. With a constant applied voltage, practical EL device use terminates when light emission levels drop below acceptable levels-e.g., readily visually detectable emission levels in ambient lighting. If the applied voltage is progressively increased to hold light emission levels constant, the field across the EL device is correspondingly increased. Eventually a voltage level is required that cannot be conveniently supplied by the EL device driving circuitry or which produces a yield gradient (volts/cm) exceeding the dielectric breakdown strength of the layers separating the electrodes, resulting in a catastrophic failure of the EL device.

It has been discovered that the stability and sustained operating performance of the organic EL devices can be markedly improved by driving the EL device with a particularly designed alternating voltage source (AC). This AC drive can greatly extend the useful life and the reliability of the organic EL device by eliminating the catastrophic failure frequently encountered in the device operated in a DC mode. With AC drive, the impedance of the EL device shows little variance with operation. Thus, the current flowing through the EL device under constant AC does not change significantly with time. As a result, it is not necessary to gradually increase the drive voltage on the EL device during operation which would eventually cause catastrophic failure due to a dielectric breakdown of the organic film.

In addition, the AC drive is crucial in eliminating the shorting pathways due to located or point defects often found in the organic EL devices. These defects form semiconductive paths between the anode and cathode. In operation, these paths shunt the current which would otherwise flow through the organic EL film generating electroluminescence. These parasitic current conducting paths were found to be easily eliminated by the application of AC drive, resulting in higher luminance efficiency and operational stability.

While any AC drive scheme is better than a DC drive scheme in operating an organic EL device, it has been found that a certain form of asymmetric AC gives the best performance in sustaining the operational life. The asymmetric scheme comprises an AC voltage cycle in which the reverse voltage portion of the AC cycle is no less than the forward portion of the AC cycle. By reverse portion of the AC cycle, it means that the voltage on the cathode is more positive than the voltage on the anode and vice versa for the forward portion.

Furthermore, it was found that the time duration of the reverse portion ($t_r$) can be significantly shorter than the time duration for the forward portion ($t_f$) in the AC cycle. This asymmetry in allotted time is advantageous in operating the EL device because it provides more time for the generation of electroluminescence which is only produced in the forward portion of the AC cycle.

BRIEF DESCRIPTION OF THE DRAWINGS

These and other advantages of this invention can be better appreciated by reference to the following detailed description considered in conjunction with the drawings in which.

DETAILED DESCRIPTION OF THE PREFERRED EMBODIMENTS

Figure 1:
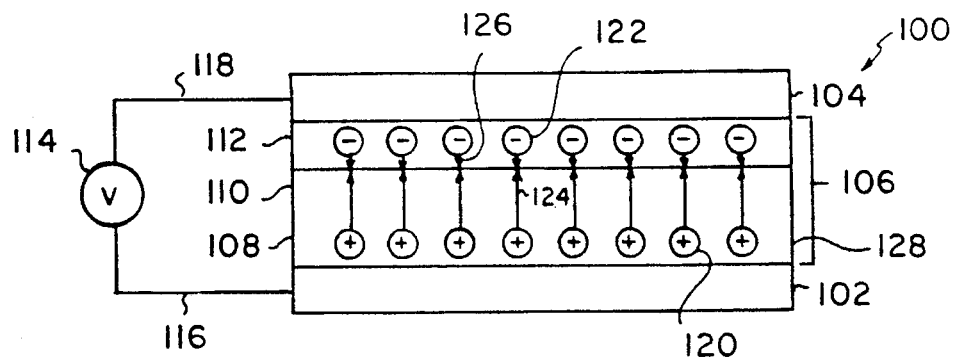
FIGS. 1, 2 and 3 are schematic diagrams of EL devices.

An electroluminescent or EL device 100 according to the invention is schematically illustrated in FIG. 1. Anode 102 is separated from cathode 104 by an organic luminescent medium 106, which, as shown, consists of three superimposed layers. Layer 108 located on the anode forms a hole injecting zone of the organic luminescent medium. Located above the hole injecting layer is layer 110, which forms a hole transporting zone of the organic luminescent medium. Interposed between the hole transporting layer and the cathode is layer 112, which forms an electron injecting and transporting zone of the organic luminescent medium. The anode and the cathode are connected to an external AC power source 114 by conductors 116 and 118, respectively. The power source produces the waveform of FIG. 4. Conventional AC power sources, including any desired switching circuitry, can be employed which are capable of positively biasing the anode with respect to the cathode. Either the anode or cathode can be at ground potential. Reverse biasing of the electrodes reverses the direction of mobile charge migration, deplete the luminescent medium of mobile charge carriers, and terminates light emission.

The EL device can be viewed as a diode which is forward biased when the anode is at a higher potential than the cathode. Under these conditions injection of hole (positive charge carriers) occurs into the lower organic layer, as schematically shown at 120, while electrons are injected into the upper organic layer, as schematically shown at 122, into the luminescent medium. The injected holes and electrons each migrate toward the oppositely charged electrode, as shown by the arrows 124 and 126, respectively. This results in hole-electron recombination. When a migrating electron drops from its conduction potential to a valence band in filing a hole, energy is released as light. Hence the organic luminescent medium forms between the electrodes a luminescence zone receiving mobile charge carriers from each electrode. Depending upon the choice of alternative constructions, the released light can be emitted from the organic luminescent material through one or more edges 128 of the organic luminescent medium separating the electrodes, through the anode, through the cathode, or through any combination of the foregoing.

Since the organic luminescent medium is quite thin, it is usually preferred to emit light through one of the two electrodes. This is achieved by forming the electrodes as a translucent or transparent coating, either on the organic luminescent medium or on a separate translucent or transparent medium or on a separate translucent or transparent support. The thickness of the coating is determined by balancing light transmissions (or extinction) and electrical conductance (or resistance). A practical balance in forming a light transmissive metallic electrode is typically for the conductive coating to be in the thickness range of 50 to 250 Angstroms. Where the electrode is not intended to transmit light or is formed of a transparent material, such as a transparent conductive metal oxide, any greater thickness found convenient in fabrication can also be employed.

Figure 2:
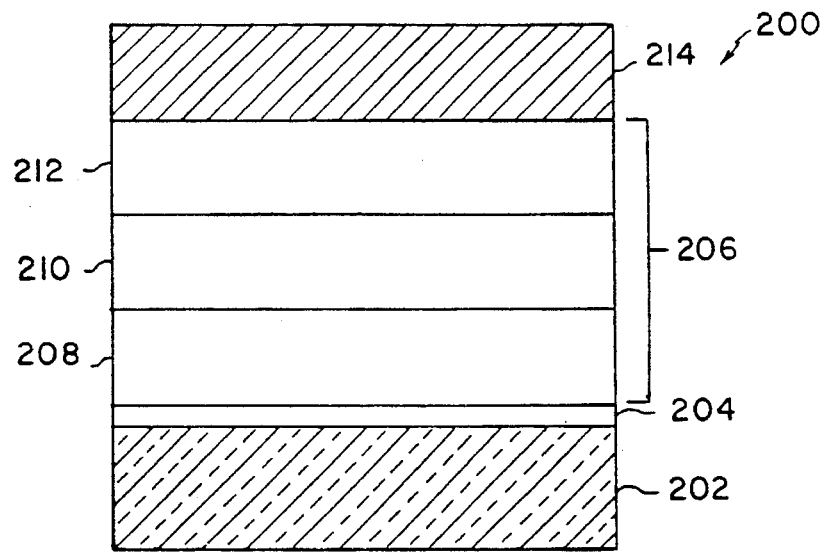

Organic EL device 200 shown in FIG. 2 is illustrative of one preferred embodiment of the invention. Because of the historical development of organic EL devices it is customary to employ a transparent anode. This is achieved by providing a transparent insulative support 202 onto which is deposited a conductive light transmissive relatively high work function metal or metal oxide layer to form anode 204. The organic luminescent medium 206 and therefore each of its layers 208, 210, and 212 correspond to the medium 106 and its layers 108, 110, and 112, respectively, and require no further description. With preferred choices of materials, described below, forming the organic luminescent medium the layer 212 is the zone in which luminescence occurs. The cathode 214 is conveniently formed by deposition on the upper layer of the organic luminescent medium.

Figure 3:
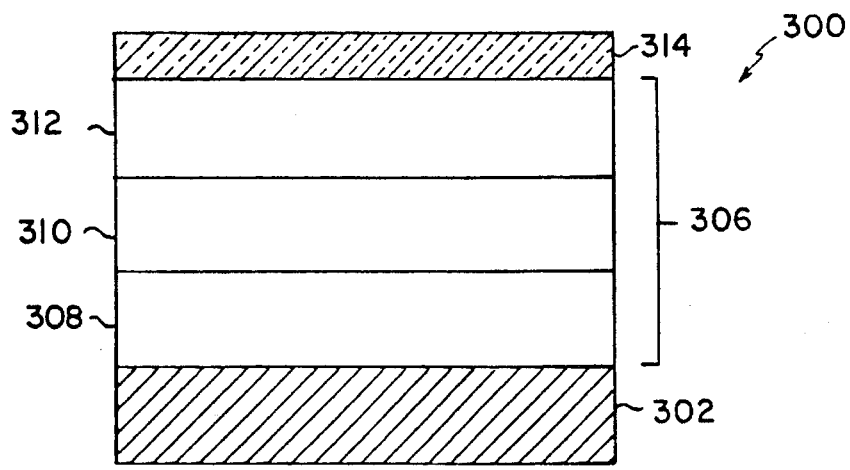

Organic EL device 300, shown in FIG. 3, is illustrative of another preferred embodiment of the invention. Contrary to the historical pattern of organic EL device development, light emission from the device 300 is through the light transmissive (e.g. transparent or substantially transparent) cathode 314. While the anode of the device 300 can be formed identically as the device 200, thereby permitting light emission through both anode and cathode, in the preferred form shown the device 300 employs an opaque charge conducting element forming the anode 302, such as a relatively high work function metallic substrate. The organic luminescent medium 306 and therefore each of its layers 308, 310, and 312 correspond to the medium 106 and layers 108, 110, and 112, respectively and require no further description. The significant difference between devices 200 and 300 is that the latter employs a thin, light transmissive (e.g., transparent or substantially transparent) cathode in place of the opaque cathode customarily included in the organic EL devices, and in most instances, employs an opaque anode instead of the light transmissive anode normally employed.

Viewing organic EL devices 200 and 300 together, it is apparent that the present invention offers the option of mounting the devices on either a positive or negative polarity opaque substrate.

The organic luminescent medium of the EL devices of this invention contains a minimum of three separate organic layers, at least one layer forming the electron injecting and transporting zone of the device, and at least two layers forming the hole injecting and transporting zone, one layer of the latter zone providing a hole injecting zone and the remaining layer providing a hole transporting zone.

A layer containing a porphyrinic compound forms the hole injecting zone of the organic EL device. A porphyrinic compound is any compound, natural or synthetic, which is derived from or includes a porphyrin structure, including porphine itself. Any of the prophyrinic compounds disclosed by Adler, U.S. Pat. No. 3,935,031 or Tang U.S. Pat. No. 4,356,429, the disclosures of which are here incorporated by reference, can be employed.

Preferred porphyrinic compounds are those of structural formula (1):

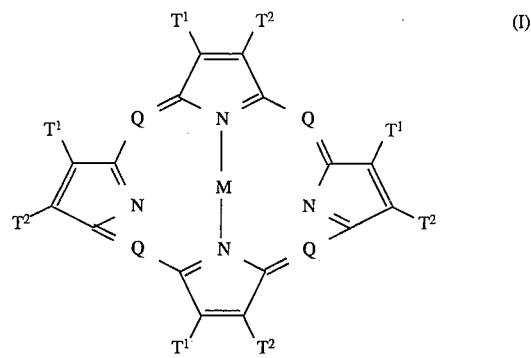

wherein

Q is —N= or —C(R)=;

M is a metal, metal oxide, or metal halide;

R is hydrogen, alkyl, aralkyl, aryl, or alkaryl; and $T^1$ and $T^2$ represent hydrogen or together complete a unsaturated 6 member ring, which can include substituents, such as alkyl or halogen. Preferred 6 membered rings are those formed of carbon, sulfur, and nitrogen ring atoms. Preferred alkyl moieties contain from about 1 to 6 carbon atoms while phenyl constitutes a preferred aryl moiety.

In an alternative preferred form the porphyrinic compounds differ from those of structural formula (I) by substitution of two hydrogens for the metal atom, as indicated by formula (II):

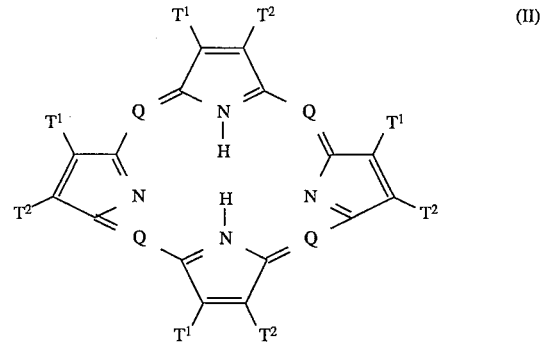

Highly preferred examples of useful porphyrinic compounds are metal free phthalocyanines and metal containing phthalocyanines. While the porphyrinic compounds in general and the phthalocyanines in particular can contain any meal, the metal preferably has a positive valence of two or higher. Exemplary preferred metals are cobalt, magnesium, zinc, palladium, nickel, and, particularly, copper, lead, and platinum.

Illustrative of useful porphyrinic compounds are the following:

| | |
|---|---|
| PC-1: | Prophine |
| PC-2: | 1,10,15,20-tetraphenyl-21H,23H-porphine copper (II) |
| PC-3: | 1,10,15,20-tetrapheyl-21H,23H-porphine zinc (II) |
| PC-4: | 5,10,15,20-tetrakis(pentafluorophenyl)-21H,23H-porphine |
| PC-5: | Silicon phthalocyanine oxide |
| PC-6: | Aluminum phthalocyanine chloride |
| PC-7: | Phthalocyanine (metal free) |
| PC-8: | Copper tetramethylphthalocyanine |
| PC-10: | Copper phthlocyanine |
| PC-11: | Chromium phthalocyanine fluoride |

PC-12: Zinc phthalocyanine
PC-13: Lead phthalocyanine
PC-14: Titanium phthalocyanine oxide
PC-15: Magnesium phthalocyanine
PC-16: Copper octamethylphthalocyanine The hole transporting layer of the organic EL device contains at least one hole transporting aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monarylamine, diarylamine, triarylamine, or a polymeric arylamine. Exemplary monomeric triarylamines are illustrated by Klupfel et al U.S. Pat. No. 3,180,730. Other suitable triarylamines substituted with vinyl or vinyl radicals and/or containing at least one active hydrogen containing group are disclosed by Brantley et al U.S. Pat. Nos. 3,567,450 and 3,658,520.

A preferred class of aromatic tertiary amines are those which include at least two aromatic tertiary amine moieties. Such compounds include those represented by structural formula (III).

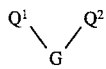

wherein
  $Q^1$ and $Q^2$ are independently aromatic tertiary amine moieties and
  G is a linking group such as an arylene, cycloalkylene, or alkylene group of a carbon to carbon bond.

A particularly preferred class of triarylamines satisfying structural formula (III) and containing two triarylamine moieties are those satisfying structural formula (IV):

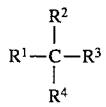

where
  $R^1$ and $R^2$ each independently represents a hydrogen atom, an aryl group, or an alkyl group or $R^1$ and $R^2$ together represent the atoms completing a cycloalkyl group and
  $R^3$ and $R^4$ each independently represents an aryl group which is in turn substituted with a diaryl substituted amino group, as indicated by structural formula (V):

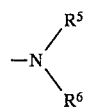

wherein $R^5$ $R^6$ are independently selected aryl groups.

Another preferred class of aromatic tertiary amines are tetraaryldiamines. Preferred tetraaryldiamines include two diarylamino groups, such as indicated by formula (V), linked through an arylene group. Preferred tetraarylkdiamines include those represented by formula (VI).

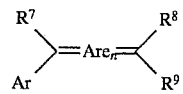

wherein
  Are is an arylene group,
  n is an integer of from 1 to 4, and
  Ar, $R^7$, $R^8$, and $R^9$ are independently selected aryl groups.

The various alkyl, alkylene, aryl, and arylene moieties of the foregoing structural formulae (III), (IV), (V), can each in turn be substituted. Typical substituents including alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms-e.g., cyclopentyl, cyclohexyl, and cycloheptyl ring structures. The aryl and arylene moieties are preferably phenyl and phenylene moieties.

While the entire hole transporting layer of the organic electroluminesce medium can be formed of a single aromatic tertiary armine, it is a further recognition of this invention that increase stability can be realized by employing a combination of aromatic tertiary amines. Specifically, as demonstrated in the examples below, it has been observed that employing a triarylamine, such as a triarylamine satisfying the formula (IV), in combination with a tetraaryldiamine, such as indicated by formula (VI), can be advantageous. When a triarylamine is employed in combination with a tetraaryldiamine, the latter is positioned as a layer interposed between the triarylamine and the electron injecting and transporting layer.

Representative useful aromatic tertiary amines are disclosed by Berwick et al U.S. Pat. No. 4,175,960 and Van Slyke et al U.S. Pat. No. 4,539,507, here incorporated by reference. Berwick et al in addition discloses as useful hole transporting compounds N substituted carbazoles, which can be viewed as ring bridged variants of the diaryl and triarylamines disclosed above.

Illustrative of useful aromatic tertiary amines are the following:

ATA-1:  1,1-Bis(4-di-p-tolylaminophenyl)cyclohexane
ATA-2:  1,1,-Bis(4-di-p-tolylaminophenyl)-4-phenylcyclohexane
ATA-3:  4,4'-Bis(diphenylamino)quadriphenyl
ATA-4:  Bis(4-dimethylamino-2-methylphenyl)-phenylmethane
ATA-5:  N,N,N-Tri(p-tolyl)amine
ATA-6:  4-(di-p-tolylamino)-4'-[4(di-p-tolylamino)-styryl]stilbene
ATA-7:  N,N,N',N'-Tetra-p-tolyl-4-4'-diaminobiphenyl
ATA-8:  N,N,N',N'-Tetraphenyl-4,4'-diaminobiphenyl
ATA-9:  N-Phenylcarbazole
ATA-10: Poly(N-vinylcarbazole)

A preferred thin film forming materials for use in forming the electron injecting and transporting layers of the organic EL devices of this invention is metal chelated oxinoid compounds, including chelates of oxine itself (also commonly referred to as 8-quinolinol or 8-hydroxyquinoline). Such compounds exhibit both high levels of performance and are readily fabricated in the form of thin films. Exemplary of contemplated oxinoid compounds are those satisfying structural formula (VII).

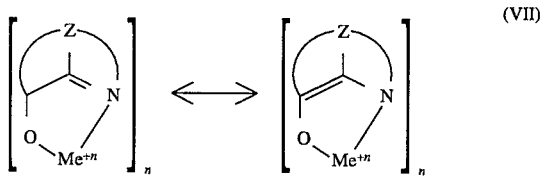

wherein
  Me represents a metal;
  n is an integer of from 1 to 3; and
  Z independently in each occurrence represents the atoms completing a nucleus having at least two fused aromatic rings.

From the foregoing it is apparent that the metal can be monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is preferably maintained at 18 or less.

Illustrative of useful chelated oxinoid compounds are the following:

| | |
|---|---|
| CO-1: | Aluminum trisoxine [a.k.a, tris(8-quinolinol)aluminum] |
| CO-2: | Magnesium bisoxine [a.k.a. bis(8-quinolinol)-magnesium] |
| CO-3: | Bis[benzo{f}-8-quinolinol]zinc |
| CO-4: | Bis(2-methyl-8-quinolinolato)aluminum oxide |
| CO-5: | Indium trisoxine [a.k.a., tris(8-quinolinol)indium] |
| CO-6: | Aluminum tris(5-methyloxine) [a.k.a. tris(5-methyl-8-quinolinol)aluminum |
| CO-7: | Lithium oxine (a.k.a., 8-quinolinol lithium) |
| CO-8: | Gallium tris(5-chlorooxine) [a.k.a., tris(5-chloro-8-quinolinol)gallium] |
| CO-9: | Calcium bis(5-chlorooxine) [a.k.a., bis(5-chloro-8-quinolinol)calcium] |
| CO-10: | Poly[zinc(II)-bis(8-hydroxy-5-quinolinyl)methane] |
| CO-11: | Dilithium epindolidione |

In the organic EL devices of the invention, it is possible to maintain a current density compatible with efficient light emission while employing a relatively low voltage across the electrodes by limiting the total thickness of the organic luminescent medium to less than 1 µm (10,000 Angstroms). At a thickness of less than 1 µm an applied voltage of 20 volts results in a field potential of greater than $2\times10^5$ volts/cm, which is compatible with efficient light emission. An order of magnitude reduction (to 0.1 µm or 100 Angstroms) in thickness of the organic luminescent medium, allowing further reductions in applied voltage and/or increase in the field potential and hence current density, are well within device construction capabilities.

One function which the organic luminescent medium performs is to provide a dielectric barrier to prevent shorting of the electrodes on electrical biasing of the EL device. Even a single pin hole extending through the organic luminescent medium will allow shorting to occur. Unlike conventional EL devices employing a single highly crystalline luminescent material, such as anthracene, for example, the EL devices of this invention are capable of fabrication at very low overall organic luminescent medium thicknesses without shorting. One reason is that the presence of three superimposed layers greatly reduces the chance of pin holes in the layers being aligned to provide a continuous conduction path between the electrodes. This in itself permits one or even two of the layers of the organic luminescent medium to be formed of materials which are not ideally suited for film formation on coating while still achieving acceptable EL device performance and reliability.

The preferred materials for forming the organic luminescent medium are each capable of fabrication in the form of a thin film-that is, capable of being fabricated as a continuous layer having a thickness of less than 0.5 µm or 5000 Angstroms.

When one or more of the layers of the organic luminescent medium are solvent coated, a film forming polymeric binder can be conveniently codeposited with the active material to assure a continuous layer free of structural defects, such as pin holes. If employed, a binder must, of course, itself exhibit a high dielectric strength, preferably at least about $2\times10^6$ volt/cm. Suitable polymers can be chosen from a wide variety of known solvent cast addition and condensation polymers. Illustrative of suitable condensation polymers are polyesters, polycarbonates, polyimides, and polysulfones. To avoid unnecessary dilution of the active material, binders are preferably limited to less than 50 percent by weight, based on the total weight of the material forming the layer.

The preferred active materials forming the organic luminescent medium are each film forming materials and capable of vacuum vapor deposition. Extremely thin defect free continuous layers can be formed by vacuum vapor deposition. Specifically, individual layer thicknesses as low as about 50 Å can be present while still realizing satisfactory EL device performance. Employing a vacuum vapor deposited porphorinic compound as a hole injecting layer, a film forming aromatic tertiary amine as a hole transporting layer (which can in turn be comprised of a triarylamine layer and a tetraaryldiamine layer), and a chelated oxinoid compound as an electron injecting and transporting layer, individual layer thicknesses in the range of from about 50 to 5000 Å are contemplated, with layer thicknesses in the range of from 100 to 2000 Å being preferred. It is generally preferred that the overall thickness of the organic luminescent medium be at least about 1000 Å.

The anode and cathode of the organic EL device can each take any convenient conventional form. Where it is intended to transmit light from the organic EL device through the anode, this can be conveniently achieved by coating a thin conductive layer onto a light transmissive substrate—e.g., a transparent or substantially transparent glass plate or plastic film. In one form the organic EL devices of this invention can follow the historical practice of including a light transmissive anode formed of tin oxide or indium tin oxide coated on a glass plate, as disclosed by Gurnee et al U.S. Pat. No. 3,172,862, Curnee U.S. Pat. No. 3,173,050, Dresner "Double Injection Electroluminescence in Anthracene", RCA Review, Volume 30, pages 322–334, 1969; and Dresner U.S. Pat. No. 3,710,167 cited above. While any light transmissive polymeric film can be employed as a substrate, Gillson U.S. Pat. No. 2,733,367 and Swindells U.S. Pat. No. 2,941,104 disclose polymeric films specifically selected for this purpose.

As employed herein the term "light transmissive" means simply that the layer or element under discussion transmits greater than 50 percent of the light of at least one wavelength it receives and preferably over at least a 100 nm interval. Since both specular (unscattered) and diffused (scattered) emitted light are desirable device outputs, both translucent and transparent or substantially transparent materials are useful. In most instances the light transmissive layers or elements of the organic EL device are also colorless or of neutral optical density—that is, exhibiting no markedly higher absorption of light in one wavelength range as compared to another. However, it is, of course, recognized that the light transmissive electrode supports or separate superimposed films or elements can be tailored in their light absorption properties to act as emission trimming filters, if desired. Such an electrode construction is disclosed, for example, by Fleming U.S. Pat. No. 4,035,686. The light transmissive conductive layers of the electrodes, where fabricated of thicknesses approximating the wavelengths or multiples of the light wavelengths received can act as interference filters.

Contrary to historical practice, in one preferred form the organic EL devices of this invention emit light through the cathode rather than the anode. This relieves the anode of any requirement that it be light transmissive, and it is, in fact, preferably opaque to light in this form of the invention. Opaque anodes can be formed of any metal or combination of metals having a suitably high work function for anode construction. Preferred anode metals have a work function of greater than 4 electron volts (eV). Suitable anode metals can be chosen from among the high (>4 eV) work function metals listed below. An opaque anode can be formed of an opaque metal layer on a support or as a separate metal foil or sheet.

The organic EL devices of this invention can employ a cathode constructed of any metal, including any high or low work function metal, heretofore taught to be useful for this purpose. Unexpected fabrication, performance, and stability advantages have been realized by forming the cathode of a combination of a low work function metal and at least one other metal. For further disclosure, see U.S. Pat. No. 4,885,211 by Tang and Van Slyke, the disclosure of which is incorporated by reference herein.

Figure 4:
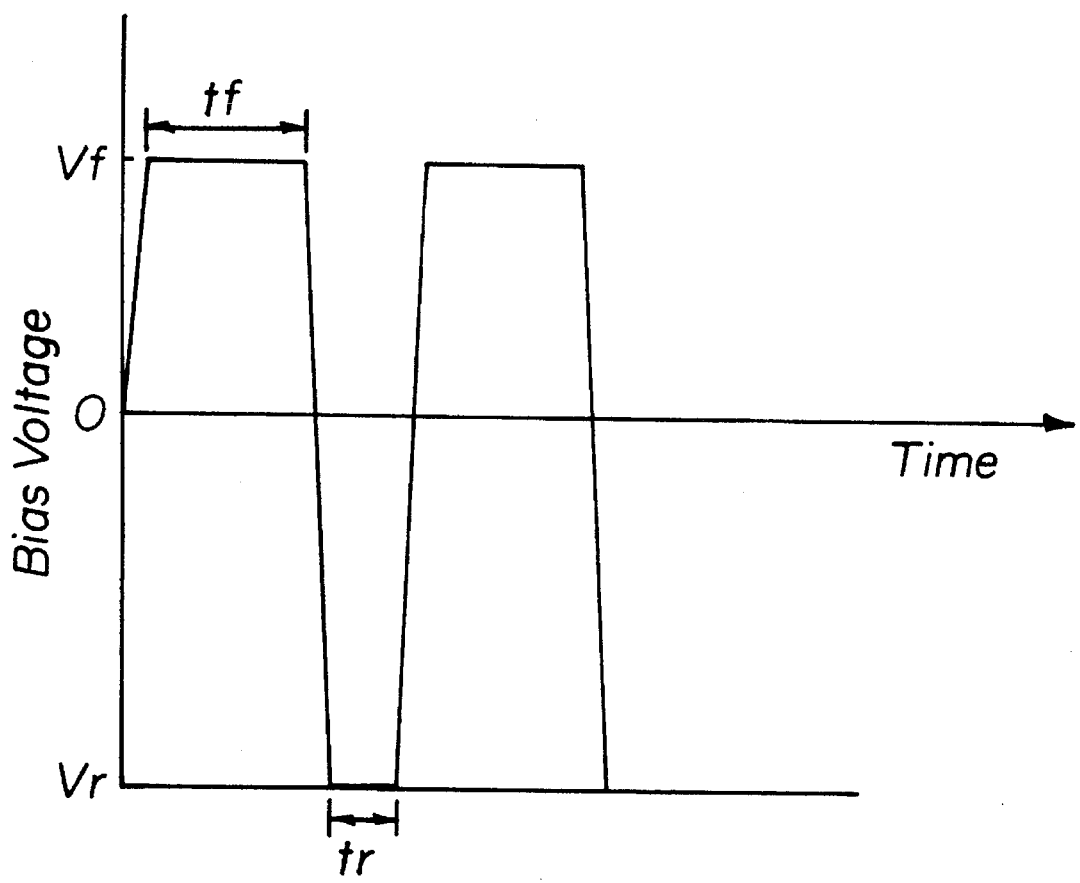
FIG. 4 is a diagram of an AC drive voltage waveform in accordance with the present invention.

FIG. 4 shows the schematic of an AC waveform suitable for driving the organic EL device. In the forward portion of the AC cycle, the hole injecting electrode adjacent to the hole injecting organic layer is biased to a positive voltage, Vf volts, with respect to the electron injecting electrode adjacent to the electron transport or luminescent layer. The forward portion is maintained for a period of time, $t_f$. At the end of this period, a negative voltage, Vr volts, is now applied to the hole injecting electrode with respect to the electron injecting electrode. This reverse portion of the waveform is maintained for a period of $t_r$. The repetition of this waveform constitutes the AC drive scheme for the organic EL.

A characteristic of the AC waveform is that in the forward portion there is hole and electron injection from the respective electrodes resulting in a conductive current through the EL device and an observable electroluminescence. In the reverse portion of the waveform, there is no appreciable injection of either holes or electrons into the organic layers from the respective electrodes, therefore the conductive current is insignificant and there is observable electroluminescence.

In accordance with the present invention the waveform for the organic EL operation has an asymmetric potential in the forward and reverse portions. Referring to FIG. 4, the preferred AC drive scheme has a waveform in which Vr is greater than or equal to Vf. Vf determines the magnitude of the conductive current through the EL device and therefore its light output power. Vr can assume any value as long as it does not exceed the dielectric breakdown voltage that can be maintained by the EL device. Considering that the breakdown field strength is generally no greater than 5E+6 volt/cm, Vr can be as large as 100 volts for a typical 2000 Å EL device. A preferred range for Vr is $Vf \leq Vr < (Eb * d)$, wherein Eb is the dielectric breakdown field of the organic EL device and d is total thickness of the organic layers.

The waveform for the organic EL operation also has an unequal time duration for the forward and reverse portion of the AC waveform. The duty cycle for the reverse portion, $t_r/(t_f+t_r)$, can be considerably smaller than the duty cycle for the forward portion, $t_f/(t_f+t_r)$. In accordance with this invention, the EL device is maintained in the reverse bias for a relatively short period of time in comparison with the forward bias. Since this reverse period is needed only for the purpose of preventing catastrophic failure of the EL device, it is desirable to keep this period as short as possible so that the majority of the AC cycle can be allocated to the forward portion for EL generation. The minimum $t_r$ should be at least $0.001*t_f$.

The frequency of the AC waveform should be in the range of 10 Hz to $10^6$ Hz. Below 10 Hz the light generation will become intermittent and would be desirable for general display application. Above $10^6$ hz the response of the EL device would not be able to follow the drive waveform.

EXAMPLE 1

An organic EL device was constructed according to Example 1 of U.S. Pat. No. 4,720,432. The device configuration is the following:

ITO/CuPc (350 Å)TTB (350 Å)/Alq (600 Å)/Mg:Ag

TTB is identified as ATA-7 and Alq as CO-1 in U.S. Pat. No. 4,720,432. The EL device was excited by applying a constant current AC power source of 1000 Hertz frequency to the EL electrodes. The EL light output was monitored continuously by a photocell. The current was 20 mA/cm$^2$ and the voltage was about 7 volts (RMS). A useful light level of about 25 candela/square meter was maintained for over 4000 hours. The AC drive voltage is relatively stable (<1 volt rise) over this period of time. The catastrophic failure did not occur.

EXAMPLE 2

(control example)

A standard device identical to the one used in Example 1 was driven under a DC power source. The current was maintained constant at 20 mA/cm$^{-2}$. The initial voltage was 8 volts. Under this DC excitation, the initial light output was about the same as the EL device described in Example 1, but the device developed shorts and failed catastrophically in about 150 hours. The DC drive voltage also experienced a more rapid rise from 8 volts to 11.5 volts during this period of time.

EXAMPLE 3

Numerous EL devices of similar configuration have been tested under both AC and DC excitation. Invariably, the DC excited EL devices failed in the catastrophic mode in less than 2000 hours, and more frequently in the first two to three hundred hours. The AC excited EL devices almost always maintained a continuous operation without suffering from catastrophic failure with a projected lifetime in excess of 10,000 hours.

The invention has been described in detail with particular reference to certain preferred embodiments thereof, but it will be understood that variations and modifications can be effected within the spirit and scope of the invention.

| Parts List | |
|---|---|
| 100 | EL Device |
| 102 | Anode |
| 104 | Cathode |
| 106 | Organic luminescent medium |
| 108 | Superimposed layer |
| 110 | Superimposed layer |
| 112 | Superimposed layer |
| 114 | External power source |
| 116 | Conductor |
| 118 | Conductor |
| 120 | Lower organic layer |
| 122 | Upper organic layer |

-continued

Parts List

| | |
|---|---|
| 124 | Holes |
| 126 | Electrons |
| 128 | Edges |
| 200 | Electroluminescent device |
| 202 | Transparent insulative support |
| 204 | Anode |
| 206 | Organic luminescent medium |
| 208 | Layer |
| 210 | Layer |
| 212 | Layer |
| 214 | Cathode |
| 300 | Electroluminescent device |
| 302 | Anode |
| 306 | Organic luminescent medium |
| 308 | Layer |
| 310 | Layer |
| 312 | Layer |
| 314 | Cathode |

What is claimed is:

1. In an organic light emitting device (LED) having an anode and cathode and a light emitting structure disposed between such anode and cathode, the improvement comprising:

(a) an organic hole transporting layer;
   (b) an organic luminescent layer; and
   (c) means for applying an alternating voltage across the anode and cathode having a forward voltage portion which biases the LED to produce light and a reverse voltage portion in which substantially no light is produced, the voltage being selected so that the maximum forward voltage is less than or equal to the maximum reverse voltage in each AC voltage cycle, wherein the time that the forward voltage portion takes ($t_f$) is longer than time ($t_r$) the reverse voltage portion takes.

2. In an organic light emitting device (LED) having an anode and cathode and a light emitting structure disposed between such anode and cathode, the improvement comprising:

(a) an organic hole injecting layer;
   (b) an organic hole transporting layer;
   (c) an organic luminescent layer; and
   (d) means for applying an alternating voltage across the anode and cathode having a forward voltage portion which biases the LED to produce light and a reverse voltage portion in which substantially no light is produced, the voltage being selected so that the maximum forward voltage is less than or equal to the maximum reverse voltage in each AC voltage cycle, wherein the time that the forward voltage portion takes ($t_f$) is longer than time ($t_r$) the reverse voltage portion takes.

3. In an organic light emitting device (LED) having an anode and cathode and a light emitting structure disposed between such anode and cathode, the improvement comprising:

(a) an organic layer containing a hole injecting porphyrinic compound and a hole transporting automatic tertiary amine;
   (b) an organic luminescent layer;
   (c) an electron transporting layer; and
   (d) means for applying an alternating voltage across the anode and cathode having a forward voltage portion which biases the LED to produce light and a reverse voltage portion in which substantially no light is produced, the voltage being selected so that the maximum forward voltage is less than or equal to the maximum reverse voltage in each AC voltage cycle, wherein the time that the forward voltage portion takes ($t_f$) is longer than time ($t_r$) the reverse voltage portion takes.

4. An organic light emitting device as set forth in claim 3 wherein the frequency of the AC voltage is within the range of 10 Hz to $10^{+6}$ Hz.

5. In an organic light emitting device (LED) having an anode and cathode and a light emitting structure disposed between such anode and cathode, the improvement comprising:

(a) an organic hole transporting layer;
   (b) an organic luminescent layer; and
   (c) means for applying an alternating voltage across the anode and cathode having a forward voltage portion which biases the LED to produce light and a reverse voltage portion in which substantially no light is produced, the voltage being selected so that the maximum forward voltage is less than or equal to the maximum reverse voltage in each AC voltage cycle, wherein the reverse voltage portion ($t_r$) is at least 0.001×the forward voltage portion ($t_f$).

* * * * *